STABLE-FAST START ELECTROMECHANICALLY CONTROLLED OSCILLATOR
Filed Sept. 20, 1967
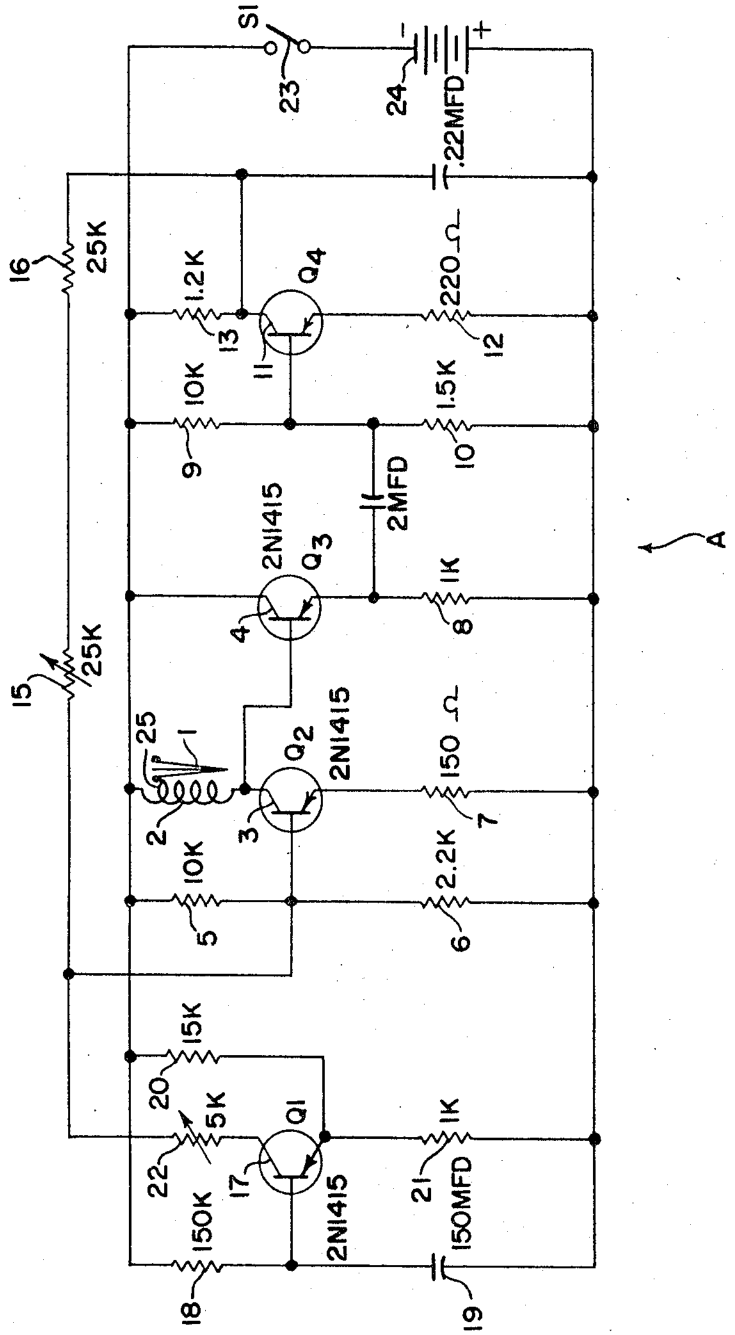
INVENTOR.
ROBERT B. McLEOD
BY
*Meyer, Tilberry & Body*
ATTORNEYS United States Patent Office 3,460,057

Patented Aug. 5, 1969

3,460,057

STABLE-FAST START ELECTROMECHANICALLY CONTROLLED OSCILLATOR

Robert B. McLeod, Clinton, Mass., assignor to E. W. Bliss Company, Canton, Ohio, a corporation of Delaware Filed Sept. 20, 1967, Ser. No. 669,219
Int. Cl. H03b 3/02, 5/30, 5/36
U.S. Cl. 331—109 11 Claims

ABSTRACT OF THE DISCLOSURE

A circuit having a time delayed gain control for minimizing the distortion of the feedback of a fast-start resonant oscillator, such as the type utilizing a vibrating reed. An electronic switching device changes the effective impedance of the feedback circuit after a predetermined delay to reduce the oscillator gain.

DISCLOSURE

The present invention relates to the art of oscillators and more particularly to a stable-fast start electromechanically controlled oscillator.

The present invention is particularly adapted for controlling fast-start resonant reed oscillators and it will be discussed with particular reference thereto; however, the invention has somewhat broader applications, and it may be used in controlling other electromechanically controlled resonant oscillators.

Accurately controlled low frequency oscillators are suitable for various applications such as selective signaling systems, calling systems in radio communications and tone sources for electrical musical instruments. Electromechanical structures, including reeds vibrating in magnetic fields, have been used for accurately controlling the frequency of such oscillators. Low frequency oscillator crystals are not feasible because of excessive size and temperature sensitivity. In low frequency oscillators of the type to which the present invention is particularly adapted, the electromechanical resonator may control the frequency by controlling the feedback from the output to the input of the oscillator. Generally one or more coils drive and sense the vibrations of the electromechanical resonator for causing oscillations to be built up to a predetermined frequency and then sustained at that frequency. The low frequencies contemplated are in the neighborhood of 50 to 300 cycles per second but slight variations therefrom are not considered critical to the operation of the present invention.

As is well known, the accuracy of an electronic oscillator, particularly at these relatively low frequencies, varies substantially with both temperature and voltage changes. This often necessitated the use of expensive components, such as tantalum capacitors. Also, to achieve immediate signal response, it was necessary that the oscillator run continuously. This was due to severe distortion of the output wave form and, hence, the feedback. This distortion usually resulted from excessive loop gain in an attempt to quickly build up oscillations to a given level.

The present invention contemplates the overcoming of these problems by means of an automatic gain control circuit employing an electronic switching device which alters the feedback impedance and reduces the loop gain after a predetermined delay from initiation of the oscillator.

In accordance with the present invention, there is provided an improvement in an oscillator circuit that includes a semiconductor device, an electromechanical means for establishing the oscillator circuit frequency, a feedback circuit including an impedance for establishing a selected gain. The improvement comprises a control circuit that includes an electronic switching device, wherein the effective resistance of the control circuit changes from a first value initiation of the oscillator circuit to a second value after a predetermined delay after initiation of the oscillator circuit, and means for connecting the control circuit to the feedback circuit.

The primary object of the present invention is the provision of an oscillator incorporating a mechanically resonant member and an improved circuit wherein oscillations build up to a usable amplitude very quickly with limited distortion.

Another object of the present invention is the provision of an oscillator incorporating a mechanically resonant member and an improved circuit wherein oscillations build up rapidly, with attenuation taking place only after a predetermined delay.

A further object of the present invention is the provision of an oscillator incorporating a mechanically resonant member and an improved circuit wherein oscillations build up rapidly with a substantially distortionless output wave form.

Still a further object of this invention is the provision of oscillator incorporating a mechanically resonant member and an improved circuit wherein an electronic switching device provides a predetermined delay to change the feedback gain.

Another object of this invention is the provision of an oscillator incorporating a mechanically resonant member and an improved circuit wherein the time delayed gain control is automatic.

Further objects of this invention will be apparent from the following description of a specific example embodying the invention and the attached claims when taken in conjunction with the accompanying drawing illustrating the described specific example embodying the invention and in which the single figure is a circuit diagram of an oscillator circuit constructed in accordance with the invention.

Referring now to the drawing which is for the purpose of illustrating a preferred embodiment of the invention only and not for the purpose of limiting the same, there is shown a circuit A for developing a low frequency signal. This circuit includes resonant vibrating member 1 in the form of a reed which may be mounted in any suitable manner for vibrating at resonant frequency. This member stabilizes the frequency of circuit A to a selected value. The driving coil 2 is connected as the load to the collector electrode of a transistor 3. The base of a second transistor 4 is also connected to the collector electrode of transistor 3. Resistors 5 and 6 make up the base bias network while a resistor 7, connected to the emitter, stablizes the operating point of transistor 3. Transistor 4 and resistor 8 serve as an emitter follower or high impedance load so as not to load down the driving coil 2. Resistors 9 and 10 base bias transistor 11 and resistor 12, connected to the emitter, stabilizes the operating point of transistor 11. Resistor 13 connected to the collector, is the load for transistor 11 stage. The voltage gain of the transistor 3 stage is the ratio of the impedance of resonant vibrator 25 to resistor 7 and the gain of the transistor 11 stage is the ratio of resistor 13 (modified by the shunting networks) to resistor 12. The voltage gain of the transistor 4 stage is practically unity. The gain of the circuit increases from DC to the resonant impedance of the resonant vibrator 25 and capacitor 14 provides a high frequency break to counteract the increasing impedance of vibrator 25. Resistors 6, 15 and 16 serve as feedback resistors of the basic oscillator circuit and switch 23 initiates the operation.

In the circuit shown, the time delay switching circuit consists of electronic switch transistor 17, resistor 18 and capacitor 19 connected to the base of transistor 17, back bias network resistors 20 and 21 connected to the emitter of transistor 17, and resistor 22 connected from the collector of transistor 17 to the base of transistor 3. When transistor 17 conducts, resistor 22 is placed in shunt with resistor 6 of the feedback circuit.

OPERATION

When switch 23 is operated, voltage from the battery 24 is applied to the circuit A. A potential is developed across resistor 6, biasing transistor 3 into conduction, causing an instantaneous potential to develop across driving coil 2 and thereby shock vibrating member 1 into vibration. The vibration of the vibrating member 1 causes an electrical signal of the same frequency as the vibration 5. The electrical signal is amplified in transistor stages 4 and 11, and the amplified signal is fed back to transistor 3 via resistors 15 and 16. The signal is then further amplified, and, as long as the loop gain is greater than 1, the circuit will build up oscillations until limited by the nonlinearities of the amplifiers. The circuit wll oscillate at a frequency determined by the resonant vibrator 25, including reed 1 and coil 2, since the circuit will have its greatest gain where the impedance of resonant vibrator 25 is a maximum, which is at the resonance frequency of the vibrating reed 1.

The greater the initial shock to the vibrating reed 1, the greater will be the build-up of vibrations and the faster the oscillations will build up. Decreasing the resistance of resistor 15 will serve to increase the loop gain and further decrease the buildup time. Increasing the resistance of resistor 15 would have the opposite effect. Thus, it can be seen that resistor 15 can be used to adjust the buildup time to practically any value. However, a very fast start will cause severe distortion of the output wave due to excessive loop gain.

Transistor stage 17 is essentially a time delay switching device which places an additional shunt, resistor 22, in the feedback path to transistor 3, thereby reducing the feedback to transistor 3. Resistors 15 and 22 are preferably adjustable. However, by proper selection or adjustment of resistors 15 and 22 a distortionless output may be produced. Upon initiation of power when switch 23 is operated, resistors 20 and 21 produce a back bias for transistor 17, and, thus, the transistor 17 stage is not effective in the circuit at this time.

As capacitor 19 charges to a predetermined voltage, current begins to flow through transistor 17 and resistor 22. Resistor 22 is, thus, placed in shunt with resistor 6 of the initial feedback circuit. This reduces the impedance presented to the base of transistor 3 causing the signal impressed across coil 2 to be attenuated, thereby limiting the gain of the oscillator to a predetermined value to control the amplitude of the vibration of the reed. The time constant of resistor 18 and capacitor 19 is chosen to delay the current flow through transistor 17 to allow sufficient time for reed 1 to come up to full amplitude.

It becomes apparent that the circuit including transistor 17 prevents distortion of the initial oscillations of the oscillator circuit A by placing additional resistance into the feedback crcuit after a selected time delay.

From the foregoing discussion it will be apparent that the invention provides an oscillator incorporating a mechanical resonant structure and an improved circuit employing a preset or adjustable time delayed gain control which permits the structure to reach a usable amplitude of vibration rapidly while incorporating attenuation for producing a distortionless output.

Various structural modifications may be made in the preferred embodiment of the present invention as discussed in the drawing without departing from the spirit and scope of the invention.

Having thus described my invention, I claim:

1. A resonant reed oscillator circuit including:

a driving coil for, when energized, causing an electromagnetically associated reed to vibrate;

amplifying circuit means including at least first and second electronic control means, each having first, second and control electrodes;

said first and said second electrodes of said first electronic control means being connected in series with said driving coil for energizing said driving coil;

said first and said second electrodes of said second electronic control means being connected in parallel with said series connected driving coil and first electronic control means and adapted to be connected across a direct current voltage source;

circuit means coupling said control electrode of said second electronic control means to said second electrode of said first control means;

feed-back circuit means including a first resistance element connected between the second electrode of said second electronic control means and the control electrode of said first electronic control means, and a second resistance element for developing a feed-back signal; said second resistance element coupled between said control electrode and said first electrode of said first electronic control means;

a third resistance element;

electronic switching means having a first, second, and control electrode; said switching means, upon being energized, coupling said third resistance element in parallel with said second resistance element;

timing means for providing a signal of a given level at a predetermined time after said timing means is connected across a voltage source; and said timing means coupled to said control electrode of said switching means so that when said signal is applied to said control electrode of said switching means, said switching means is energized to couple said third resistance element in parallel with said second resistance element thereby altering the signal applied to said control electrode of said first electronic control means by said feed-back circuit means.

2. An oscillator circuit as defined in claim 1 wherein said circuit means includes a third electronic control means having a first, second, and control electrode; said first and second electrodes of said third control means being coupled in parallel with said series connected driving coil and first and second electrodes of said first electronic control means; said first electrode of said third electronic control means being coupled to said control electrode of said second control means; and said control electrode of said third control means being coupled to said second electrode of said first control means.

3. An oscillator circuit as defined in claim 2 including a first capacitance element; said first electrode and said third electronic control means is coupled through said first capacitance element to said control electrode of said second electronic control means.

4. An oscillator circuit as defined in claim 1 wherein said timing means includes a fourth resistance element and a second capacitance element coupled to said control electrode of said switching means and adapted to be coupled across a said voltage source.

5. An oscillator circuit as defined in claim 1 wherein said second resistance element is coupled to said control electrode of said first electronic control means and is adapted to be connected to a said voltage source; and said third resistance element is coupled between said second electrode of said switching means and said control electrode of said first electronic control means.

6. An oscillator circuit as defined in claim 1 wherein said second electrode of said first electronic control means is connected directly to said driving coil, and said driving coil is adapted to be connected directly to a said voltage source.

7. An oscillator circuit as defined in claim 6 wherein said driving coil is connected to a first terminal of a said voltage source, and said first electrode of said first electronic control means is coupled to a second terminal of a said voltage source.

8. An oscillator circuit as defined in claim 4 wherein said fourth resistance element is connected in series with said second capacitance element; said series connected resistance and capacitance elements are coupled in parallel with said series connected driving coil and first and second electrodes of said first electronic control means.

9. An oscillator circuit as defined in claim 8 wherein said series connected resistance and capacitance elements, said series connected driving coil and first and second electrodes of said first electronic control means, and said first and second electrodes of said second electronic control means are connected across a said voltage source.

10. An oscillator circuit as defined in claim 1 wherein said electronic switching means is a transistor having a base electrode connected to said timing means, a collector electrode connected through said third resistance element to said control electrode of said first electronic control means, and an emitter electrode adapted to be coupled to a said voltage source.

11. An oscillator circuit as defined in claim 10 wherein said first electronic control means is a transistor having a collector terminal coupled through said driving coil to one terminal of a said voltage source, and an emitter terminal coupled to the other terminal of said voltage source.

References Cited

UNITED STATES PATENTS

| | | | |
|---|---|---|---|
| 3,239,776 | 3/1966 | Shaw | 331—109 |
| 3,256,497 | 6/1966 | Walker. | |

ROY LAKE, Primary Examiner

SIEGFRIED H. GRIMM, Assistant Examiner

U.S. Cl. X.R.

331—116, 156, 183